(12) United States Patent
McRee et al.

(10) Patent No.: US 7,144,457 B1
(45) Date of Patent: Dec. 5, 2006

(54) METHODS AND DEVICES FOR ANALYZING CRYSTALLINE CONTENT OF PRECIPITATES AND CRYSTALS WITHOUT ISOLATION

(75) Inventors: Duncan McRee, San Diego, CA (US); Leslie Tari, San Diego, CA (US)

(73) Assignee: Takeda San Diego, Inc., San Diego, CA (US)

( * ) Notice: Subject to any disclaimer, the term of this patent is extended or adjusted under 35 U.S.C. 154(b) by 687 days.

(21) Appl. No.: 10/393,659

(22) Filed: Mar. 20, 2003

Related U.S. Application Data (60) Provisional application No. 60/367,387, filed on Mar. 21, 2002.

(51) Int. Cl.
*C30B 25/12* (2006.01)
(52) U.S. Cl. .................................. 117/2; 117/3; 378/73
(58) Field of Classification Search ................ 117/2, 117/3; 378/73
See application file for complete search history.

(56) References Cited

U.S. PATENT DOCUMENTS

| | | |
|---|---|---|
| 6,836,532 B1 | 12/2004 | Durst et al. |
| 2003/0159641 A1 | 8/2003 | Sanjoh et al. |
| 2004/0013231 A1 | 1/2004 | He et al. |
| 2004/0215398 A1 | 10/2004 | Mixon et al. |
| 2004/0258203 A1 | 12/2004 | Yamano et al. |

FOREIGN PATENT DOCUMENTS

WO    WO 03/032558 A2    1/1999

*Primary Examiner*—Felisa Hiteshew
(74) *Attorney, Agent, or Firm*—David J. Weitz (57) ABSTRACT

Systems and methods are provided for evaluating a crystallization experiment, where a crystallization experiment of a molecule is to X-rays while housed within a container in which the crystallization experiment is performed; and one or more X-ray diffraction patterns from the X-ray exposure are used to evaluate whether crystalline material is present in the crystallization experiment.

20 Claims, 10 Drawing Sheets

METHODS AND DEVICES FOR ANALYZING CRYSTALLINE CONTENT OF PRECIPITATES AND CRYSTALS WITHOUT ISOLATION

RELATED APPLICATION

This application claims priority from U.S. Provisional Application Ser. No. 60/367,387 filed Mar. 21, 2002, which is incorporated herein by reference in its entirety.

BACKGROUND OF THE INVENTION

1. Field of the Invention

The invention relates to methods and devices useful for analyzing crystalline content of molecules. More specifically, the methods and devices may be used to analyze crystalline content of molecules without having to isolate a precipitate or crystal of the molecule from an experiment.

2. Description of Related Art

X-ray crystallographic structure data from molecules, particularly macromolecules such as proteins and nucleic acid structures, are invaluable to structural biology. A general description of how high resolution X-ray crystal protein structures are obtained and refined from raw diffraction patterns of diffraction quality crystals and crystallization methods therefore is found in Creighton, T., *Proteins,* 2d Ed. (1993) W. H. Freeman & Co., New York.

Structural biology is a discipline that studies the correlation of molecular form and function in molecular, cell, and organismal biology and physiology. More detailed practical information on obtaining diffraction grade biomacromolecule crystals, specifically protein and protein-ligand co-crystals, may be found in McRee, D. and David. P., *Practical Protein Crystallography,* $2^{nd}$ Ed. (1999), Academic Press Inc.

One of the challenges associated with obtaining X-ray crystallographic structure data for a molecule is the formation of crystals that, upon diffraction, can yield X-ray crystallographic structure data effective for solving the structure of the molecule.

A further challenge associated with obtaining X-ray crystallographic structure data is the isolation and manipulation of crystals once they are successfully formed. Biomacromolecule crystals are typically removed from the crystallization vessel and mounted for collection of sufficient X-ray diffraction data to determine the diffraction quality of the crystals.

Without the aid of the present invention, mechanically fragile macromolecule crystals are removed from the container in which the crystals are formed and then are mounted prior to obtaining diffraction data. The handling involved in the isolation and mounting process can damage the crystals such that they are not of insufficient quality for X-ray crystallography. Even the diffraction experiment determining crystal quality can damage the crystal. Thus, any re-mounting required, for example when the crystals are mounted in a manner incompatible with cryogenic storage, can render the heretofore diffraction quality crystal useless for X-ray crystallography. Typically protein crystals are mounted for data collection in thin-walled glass capillaries or fiber loops. Several techniques for mounting biomacromolecule crystals in a capillary exist in which crystals are isolated from a previous growing location and put into the mother liquor of the crystals, or another solution resembling the solution in which the crystals were grown.

In addition to being relatively physically fragile, compared to crystals of other molecules, biomacromolecule crystals such as protein crystals are relatively susceptible to thermal degradation as well as deterioration as a result of microorganism growth. Thus protein crystals are typically stored under liquid nitrogen, in the presence of a cryoprotectant, which protects the typically hydrated protein crystal from damaging effects of the low temperatures, further complicating their manipulation (Rubinson et al. (2000) *Acta Crystallogr. D Biol. Crystallogr.:* 56:996–1001; and generally McRee, D. and David. P., *Practical Protein Crystallography,* $2^{nd}$ Ed. (1999), Academic Press Inc.).

SUMMARY OF THE INVENTION

In one embodiment, a method is provided for evaluating a crystallization experiment, the method comprising: exposing a crystallization experiment of a molecule to X-rays while housed within a container in which the crystallization experiment is performed; and using one or more X-ray diffraction patterns formed from the X-ray exposure to evaluate whether crystalline material is present in the crystallization experiment.

The above method may be used for a variety of applications. For example, in another embodiment, a method is provided for detecting ligand binding to a protein, the method comprising: exposing a precipitate and/or crystal formed in a first crystallization experiment to X-rays while housed within a container in which the first crystallization experiment is performed and collecting one or more X-ray diffraction patterns; taking a precipitate and/or crystal formed in a second crystallization experiment that further comprises a ligand relative to the first crystallization experiment and exposing the second crystallization to X-rays while housed within a container in which the second crystallization experiment is performed and collecting one or more X-ray diffraction patterns; and comparing the diffraction patterns collected from the first and second crystallization experiments, a change in the diffraction patterns between the crystallization experiments indicating the binding of the ligand to the protein.

In another embodiment, a method is provided for detecting ligand binding to a protein, the method comprising: exposing a precipitate and/or crystal formed in a crystallization experiment to X-rays while housed within a container in which the crystallization experiment is performed and collecting one or more X-ray diffraction patterns; adding a ligand to the crystallization experiment; exposing the precipitate and/or crystal crystallization experiment after the ligand has been added to X-rays while housed within a container in which the crystallization experiment is performed and collecting one or more X-ray diffraction patterns; and comparing the diffraction patterns collected before and after the ligand is added to the crystallization experiment, a change in the diffraction patterns indicating the binding of the ligand to the protein.

In another embodiment, a method is provided for detecting ligand binding to a protein comprising: forming one or more precipitates and/or crystals of a molecule in a crystallization experiment housed in a container; exposing the one or more precipitates and/or crystals to X-rays while still housed within the container in which the crystallization experiment is performed and collecting X-ray diffraction patterns, wherein multiple diffraction patterns of the one or more precipitates and/or crystals are taken at different angles and at different positions laterally relative to the one or more precipitates and/or crystals; and solving the crystal structure of the molecule based on the multiple diffraction patterns collected.

According to each of the above embodiments, the crystallization experiment may include crystallizing a molecule selected from the group consisting of a macromolecule, a protein, a molecule with a molecular weight of at least 500 Daltons, a molecule with a molecular weight of at least 1000 Daltons, and a protein.

Also according to each of the above embodiments, the container housing the crystallization experiment may be a multiwell plate configured for hanging drop crystallization experiments or sitting drop crystallization experiments, a multiwell plate configured for crystallization experiments under oil, or is a microfluidic device configured to conduct crystallization experiments.

Also according to each of the above embodiments, the container may house multiple crystallization experiments.

Also according to each of the above embodiments, the crystallization experiment may have a volume of less than 5 microliters and optionally less than 1 microliter.

Also according to each of the above embodiments, exposing the crystallization experiment to X-rays may comprise exposing the crystallization experiment to X-rays multiple times to form multiple different diffraction patterns where the X-rays traverse the crystallization experiment at different locations across the crystallization experiment among the multiple X-ray exposures. Optionally, the X-rays may traverse the crystallization experiment at at least 3, 4, 5, 6 or more different locations across the crystallization experiment among the multiple X-ray exposures. Also, the location where the X-rays traverse the crystallization experiment may be varied by moving the container housing the crystallization experiment. Where the X-rays traverse the crystallization experiment may also be varied by moving the container housing the crystallization experiment on a surface of a stage on which the container is positioned and/or by moving an X-ray source producing the x-rays.

Also according to each of the above embodiments, exposing the crystallization experiment to X-rays may comprise exposing the crystallization experiment to X-rays multiple times to form multiple different diffraction patterns where the multiple X-ray exposures together form a lateral scan of the crystallization experiment.

Also according to each of the above embodiments, exposing the crystallization experiment to X-rays may comprise exposing a given location of the crystallization experiment to X-rays multiple times where the angle of the x-ray beam is varied relative to the crystallization experiment between 0.05 degrees to 5 degrees among the different exposures at the given location of the crystallization experiment.

Also according to each of the above embodiments, exposing the crystallization experiment to X-rays may comprise exposing a given location of the crystallization experiment to X-rays multiple times where the angle of the x-ray beam is varied relative to the crystallization experiment at least 0.5 degrees among the different exposures at the given location.

Also according to each of the above embodiments, exposing the crystallization experiment to X-rays may comprise exposing the crystallization experiment to X-rays multiple times to form multiple diffraction patterns where the X-rays traverse a same portion of the crystallization experiment but the angles at which the X-rays traverse the crystallization experiment varies among the multiple X-ray exposures. Optionally, an X-ray source producing the x-rays that traverse the crystallization experiment and an X-ray detector collecting the x-rays are rotated in unison with each other where the axis of rotation is the same portion of crystallization experiment that the x-rays traverse.

Also according to each of the above embodiments, a microscope may be used to position where the x-rays traverse the crystallization experiment.

Also according to each of the above embodiments, the method may further comprise using a microscope to detect a location of a precipitate and/or crystal in the crystallization experiment and position where x-rays traverse the crystallization experiment so that the x-rays traverse the precipitate and/or crystal. Detection of precipitate and/or crystal in the crystallization experiment and positioning of where x-rays traverse the crystallization experiment may optionally be automated.

Also according to each of the above embodiments, the method may further comprise positioning where x-rays traverse the crystallization experiment so that the x-rays traverse a precipitate and/or crystal in the crystallization experiment.

Also according to each of the above embodiments, the X-rays may be produced by an x-ray source and collected by an x-ray detector, and the container housing the crystallization experiment is positioned on a stage positioned between the x-ray source and x-ray detector such that the x-rays traverse the stage as well as the container.

Also according to each of the above embodiments, the portion of the container where the X-rays traverse the container may be formed of a crystalline material. For example, the portion of the container where the X-rays traverse the container may be formed of a material selected from the group consisting of silicon and quartz. For example, the container may be a silicon or quartz wafer.

Also according to each of the above embodiments, the method may optionally further comprise detecting a crystalline property of a precipitate and/or crystal present in the crystallization experiment from the diffraction pattern, wherein the crystalline property is selected from the group consisting of resolution, mosaicity and unit cell properties.

DETAILED DESCRIPTION OF THE INVENTION

Provided are systems and methods for analyzing the crystalline content of molecules present in an experiment that avoids having to isolate a precipitate or crystal of the molecule from the experiment. The invention also relates to analysis methods that may be performed based on the x-ray diffraction patterns that are taken.

In one embodiment, a method is provided for determining the three dimensional structure of a molecule by taking multiple diffraction images of a precipitate at different positions laterally relative to the precipitate. The diffraction patterns from the diffraction images may be used in combination to determine a three dimensional structure of a molecule.

In another embodiment, a method is provided for evaluating the diffraction quality of a precipitate or crystal without first isolating the precipitate or crystal from a crystallization experiment where it was formed.

In another embodiment, ligand binding to a molecule is detected based on changes to the diffraction pattern of a precipitate or crystal where the diffraction pattern is obtained without first isolating the precipitate or crystal. The change to the diffraction pattern may be referenced against a diffraction pattern of a precipitate or crystal where no ligand has been introduced or where a different ligand has been introduced. The change to the diffraction pattern may also be referenced to a diffraction pattern taken after a precipitate or crystal has been formed but before the ligand was introduced.

Advantageously, the various methods of the present invention involving the diffraction analysis of a precipitate or crystal can be performed without having to isolate the precipitate or crystal from the experiment. As a result, the analysis can be performed directly upon a precipitate or crystal that is still present in a sample. Further, the analysis can be performed while the sample is still in the container in which the experiment was performed. For example, the experiment can be positioned in a micro titer plate, a plate adapted for performing a sitting or hanging crystallization experiment, in a micro fluidic device, under oil, and any other container comprising an array of experiment holding compartments.

According to the present invention, the crystallization experiment and the X-ray source can be moved relative to each other to find crystals or precipitate comprising crystalline material in the experiment based on a X-ray diffraction pattern being produced. In one variation, the crystallization experiment and the X-ray source are moved relative to each other in a raster motion over the lateral area occupied by the crystallization experiment. This provides a method for detecting crystals without having to isolate the crystals.

By contrast to the present invention, other methods used to identify whether an object present in an experiment is crystalline typically involve optically evaluating the appearance of the object. Then, in order to confirm whether the object is in fact crystalline, it is necessary to remove the crystal from the experiment; potentially damaging the object's crystal lattice (if it is crystalline) in the process. This invention obviates the need to remove a crystal from an experiment in order to evaluate its crystalline properties, thus avoiding damaging the crystals through mechanical manipulation.

It is noted that the methods and devices of the present invention may be adapted for high throughput applications. For example, the methods and devices can be used to analyze multiple different experiments in a same container housing the multiple experiments. In one variation, the container has a plurality of compartments, each compartment housing a separate experiment. For example, the container may comprise an array of sections, each for performing a separate experiment, such as a microtiter plate or a sitting or hanging drop crystallization experiment plate. The container may also be a plate designed to conduct crystallization experiments under oil. The container may also be a microfluidic device which can house a plurality of different experiments.

The molecule forming the precipitate and/or crystal is preferably a macromolecule, such as a protein. Other types of molecules and macromolecules may also be crystallized according to the present invention. The molecule preferably has a molecular weight of at least 500 Daltons, more preferably at least 1000 Daltons, although it is noted that the invention can be applied to molecules with lower molecular weights.

It is noted that the methods of the present invention may be performed after performing an array crystallization experiment in an attempt to identify suitable crystallization conditions. For example, the methods may be used in combination with a protein crystallization screen. A detailed description of basic protein crystallization setups may be found in McRee, D. and David. P., *Practical Protein Crystallography*, $2^{nd}$ Ed. (1999), Academic Press Inc. Performing crystallization experiments in smaller volumes including submicroliter crystallization volumes have been described in Stevens (2000) *Curr. Opin. Struct. Biol.:* 10(5):558–63, and U.S. Pat. No. 6,296,673.

Advantageously, the methods of the present invention can be performed without isolating any precipitates or crystals formed. This is particularly useful for submicroliter volume crystallizations where smaller crystals are formed. Rather, the methods may be performed in the same containers as was used to perform the crystallization screens.

In one variation, the methods of the present invention may be performed in conjunction with co-crystallization. For example, an array of crystallization experiments may be performed in a given container housing the co-crystallization experiments (e.g., a hanging or sitting drop crystallization plate). The crystallization conditions can be varied among the multiple different crystallization experiments in order to identify crystallization conditions for a particular ligand-protein complex. Any precipitates and/or crystals that are formed may be diffracted without isolating the precipitates and/or crystals in order to characterize the crystalline quality of any precipitates and/or crystals formed. Alternatively, a plurality of crystallization experiments may be performed where different potential ligands are introduced into the plurality of crystallization experiments. Precipitates and/or crystals present in the experiments may be diffracted without isolating the precipitates or crystals. The diffraction patterns produced can then be compared to a diffraction pattern produced when no ligand is introduced into the crystallization experiment, a change in the diffraction pattern when a particular ligand is introduced indicating that the ligand bound to the molecule.

In another variation, the methods of the present invention may be performed in conjunction with soaking experiments to identify ligands capable of binding to the given molecule. According to this variation, precipitates and/or crystals of a molecule, such as a protein, are formed and then are soaked with a ligand. A change in the diffraction pattern, detected according to the present invention, is used to identify which ligands bind to the protein. For example, an array of crystallization experiments may be performed in a given container housing the co-crystallization experiments (e.g., a hanging or sitting drop crystallization plate). Once precipitates and/or crystals are formed, the precipitates and/or crystals, a plurality of different potential ligands may be introduced into the crystallization experiments. The precipitates and/or crystals are then diffracted without isolating the precipitates and/or crystals. The diffraction patterns produced are then compared to a diffraction pattern produced when no ligand is introduced, a change in the diffraction pattern when a particular ligand is introduced indicating that the ligand bound to the molecule The methods and devices of the present invention will now be described with regard to the various figures.

1. Method for Screening of an Individual Experiment

Figure 1A:
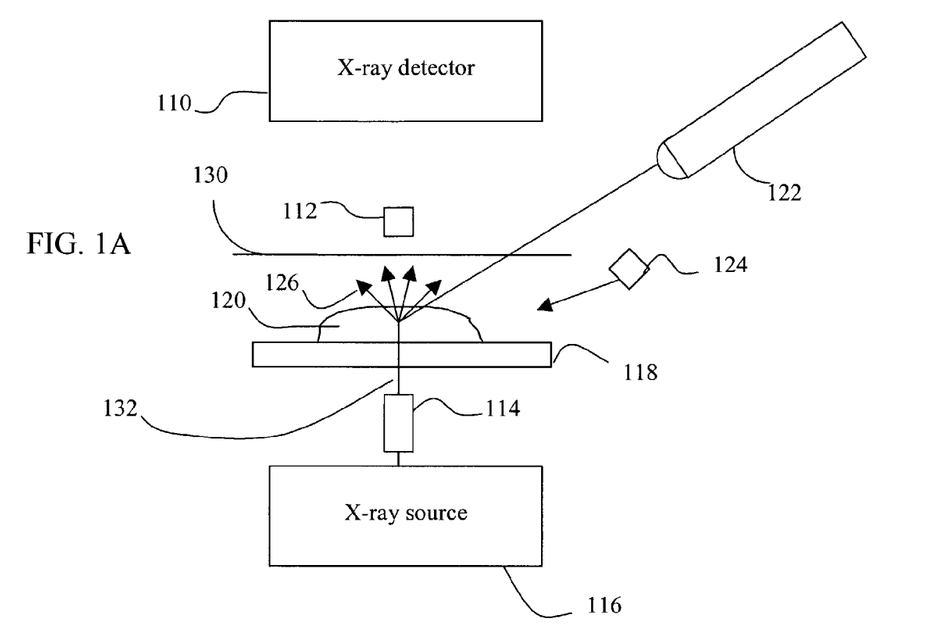
FIG. 1A illustrates the analysis by x-ray diffraction of the crystalline content of a precipitate or crystal present within an individual experiment.

FIG. 1A illustrates the analysis by x-ray diffraction of a crystalline content of a precipitate or crystal present in an experiment. As illustrated, x-rays 132 are produced from an X-ray source 116 in the direction of an X-ray detector 110. A beam stop 112 may optionally be placed in the path of the X-ray detector 110. Use of the beam stop 112 is important when the X-ray detector 110 is in the direct path of the x-ray 132 in order to protect the X-ray detector 110. In situations where the experimental set up is such that the detector is not positioned directly in line with the X-ray beam, the beam stop is optional.

A focusing optic 114 may optionally be used to focus the x-rays so that a narrow beam of x-rays traverse a sample.

As also illustrated, a sample 120 is in the path of the x-rays so that a portion of the sample may be analyzed based on a diffraction pattern produced when the x-rays traverse the sample. The sample may optionally comprise a precipitate or a crystal to be analyzed which is preferably placed in the path of the x-ray beam. As illustrated, the sample is positioned on a substrate 118 and may be enclosed by a cover 130. The substrate 118 may form a portion of a container for housing the sample. For example the sample may be housed in a micro titer plate, a plate adapted for performing a sitting or hanging crystallization experiment, under oil, in a gel or in a micro fluidic device.

A microscope 122 may be used to center the X-ray beam 132 relative to a portion of the sample, most preferably a precipitate or crystal to be analyzed that is present in the sample. Centering may be performed by moving the substrate relative to where the X-ray beam 132 will traverse the sample. To aid this positioning process, the sample may be illuminated using light source 124.

In one embodiment, positioning of the x-ray relative to a sample, and optionally to a precipitate or crystal within a sample may be automated. For example, imaging software for detecting precipitates and crystal may be used in combination with the microscope and in combination with mechanisms for moving the sample to locate and position precipitates and crystals relative to where the x-ray traverses the sample.

As the sample 120 is rocked through a 0.05–5.0° angle relative to the path of the X-ray beam, preferably a 0.5 to 2° angle, the pattern of diffracted X-rays 126, are collected and imaged by the X-ray detector 110. It is noted that the rocking of the sample relative to the X-ray beam may be accomplished by moving the sample and/or by moving the X-ray source and detector.

Examples of X-ray sources that may be used include but are not limited to X-ray tubes, rotating anodes and synchrotron radiation sources that emit X-ray radiation in the range 2 to 0.5 angstroms wavelength. Particular examples include a Rigaku RTP 300 RC rotating anode source with a RAX-ISII, MAR image plate, or MAR CCD detector.

Examples of X-ray detectors that may be used include but are not limited to photographic film, scintillation counters, charge coupled devices (CCDs) with a phosphor front screen, X-ray sensitive image plates, multiple wire proportional counters, television tube detectors and pixel array detectors using thin film transistors.

Data collected may be processed using a variety of software packages that are commercially available. For example, data may be processed by the DENZO program package and electron density maps may be calculated by the XPLOR package. Electron density maps may be inspected on a Silicon Graphics INDIGO2 workstation using QUANTA 97.

In order to optimize the ability to obtain useful diffraction data, it is desirable to minimize the number of electrons from the container in the path of the x-ray beam as it passes through the container. The number of electrons that the x-rays traverse can be reduced by choosing materials having a low atomic number or a low density. Examples of materials which are preferably used for reducing the number of electrons in the substrate material include low density plastics such as polystyrene, polyethylene, other carbon based polymers. Silicon materials, such as silicon wafers, glass, including borosilicate and soda glass, and aerogels can be suitable materials. Optically opaque materials that are suitable include Beryllium, plastic films and plastics. One important parameter is the ratio of the number of electrons within the sample to be tested should contain at least as many electrons within the area of the x-ray beam as the sum of the electrons contained in the portion of the container that the x-rays traverse. Preferably, the ratio of the electrons should be at least three, more preferably five and optimally more than ten.

It is noted that the portion of the container that the x-rays traverse may optionally be made of crystalline material. Crystalline material, unlike amorphous material, will produce a more regular diffraction pattern. Accordingly, this more regular and more spatially confined diffraction pattern will be easier to distinguish from the portion of the diffraction pattern arising from the sample and more particularly, arising from a precipitate and/or crystal in the sample to be detected. Examples of crystalline materials that may be used include, but are not limited to crystalline silicon, diamond, and quartz.

Figure 1B:
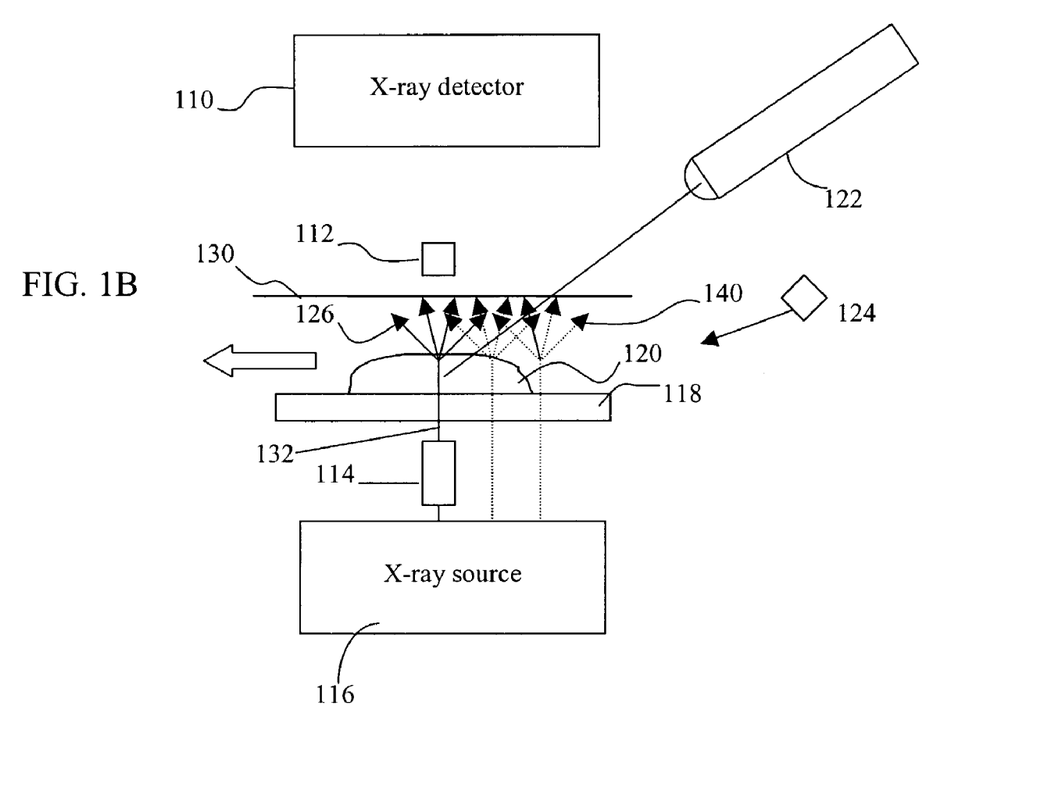
FIG. 1B illustrates the analysis of the crystalline content of a precipitate or crystal as in FIG. 1A where multiple diffraction patterns are taken at different locations laterally relative to the experiment.

FIG. 1B illustrates the analysis by x-ray diffraction of a crystalline content of a precipitate or crystal where multiple analyses are performed at different locations of the sample. Each analysis may be performed as described above in regard to FIG. 1A. After each analysis, for example after a diffraction pattern of a portion of the sample is taken at a first location, the sample may be moved laterally relative to the x-ray source. Then further analyses may be performed. Previous positions of the x-ray beam from previous analyses are shown as dotted lines 140.

As was noted in regard to FIG. 1A, a microscope may be used to locate precipitates or crystals in a sample and to align such with the x-ray beam. Using the process described in regard to FIG. 1B, by taking multiple lateral analyses, it is possible to locate crystal or crystalline precipitate in a sample without prior alignment of the x-ray source to the sample or a precipitate or crystal in the sample. Rather, by moving the X-ray source laterally relative to the sample in a systematic way, the sample can be screened and crystals or crystalline precipitate that may be present in the sample may be identified based on the resulting diffraction patterns recorded on the X-ray detector. The minimum number of diffractions to scan the entire experiment would be equal to the lateral diameter of the experiment divided by diameter width of the X-ray beam (multiplied by 0.707). This would enable the entire lateral area of the experiment to be scanned. It is noted that movement of the X-ray source laterally relative to the sample may be accomplished by moving the X-ray source and/or moving the sample.

It is also possible that a sufficient number of diffraction pattern images can be collated from multiple crystals or crystalline precipitate within the sample to provide a unique data set. This unique data set will allow for the determination of the three dimensional structure of the macromolecule in the sample by computational techniques known to one of skill in the art. Alternatively, for microcrystalline precipitate, the powder diffraction pattern can be viewed according to methods known to those of skill in the art (*Modern Powder Diffraction. Reviews in Mineralogy*, Volume 20, Edited by D. L. Bish and J. E. Post, Acta Cryst. (1994), A50, 259; *Introduction to X-ray Powder Diffractometry*, Jenkins and Snyder; *Powder Diffraction, Reports on the Progress* in Physics Vol. 59, No. 2, February 1996, pp 131–234).

2. Method for Screening of an Individual Experiment Over Multiple Angles

Figure 1C:
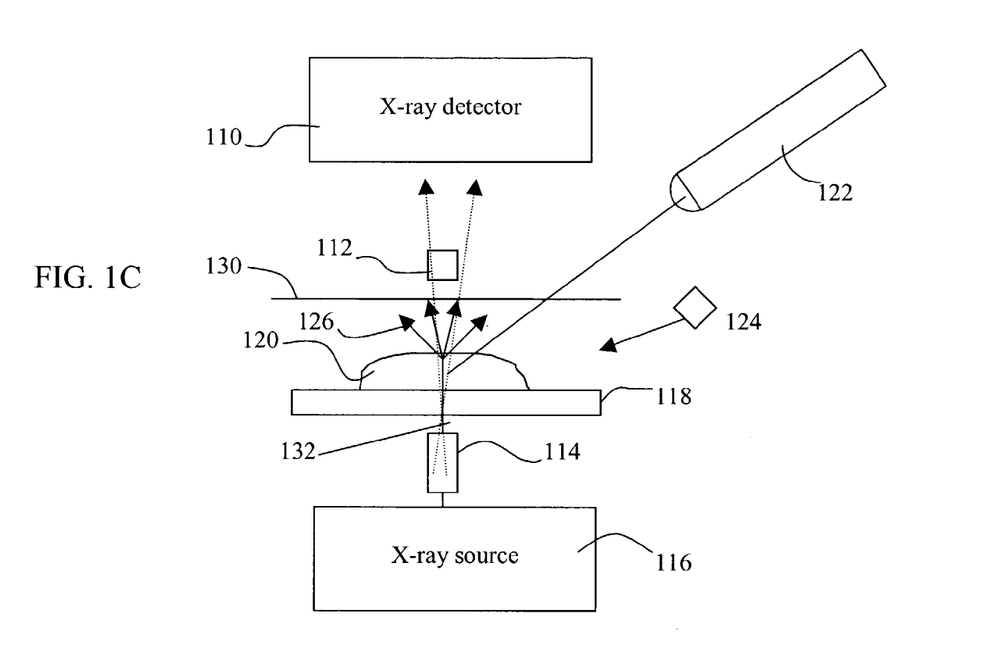
FIG. 1C illustrates the analysis of the crystalline content of a precipitate or crystal as in FIG. 1A where multiple diffraction patterns are taken at different angles relative to precipitate or crystal.

FIG. 1C illustrates the analysis by x-ray diffraction of a crystalline content of a precipitate or crystal where multiple analyses are performed at a same location of the sample but where the x-ray beam traverses the sample over a range of angles. Each analysis may be performed as was described above in regard to FIG. 1A. However, after the detector collects single or multiple images with the X-ray source, the angle at which the X-rays traverse the sample are changed. Then single or multiple images are taken with the X-ray source at the new angle. Optionally, images may be taken at 2, 3, 4, 5, 6 or more different angles. Optionally, the angle of the x-ray beam may be varied over a range of 0.05 degrees to 5 degrees, preferably 0.5 degrees to 2 degrees.

The method described in regard to FIG. 1C of taking images across multiple angles can be used for a variety of different purposes. For example, once a crystal or a precipitate with crystalline properties is located, the method may be used to characterize such crystalline properties as resolution, mosaicity and unit cell size as well as collecting diffraction pattern data.

It is noted that the method of screening across a sample may be performed in combination with the method described in regard to FIG. 1B. Hence, the method may comprise taking images at various lateral positions relative to the sample and taking a plurality of images at the different locations where images are taken at multiple different angles. This method has utility for determining the three dimensional structure of a molecule. As will be discussed herein, this method also has utility for detecting ligand binding to the molecule forming the precipitate or crystal.

3. Method for Detecting Ligand Binding

A method is also provided for screening whether a potential ligand binds to a molecule, typically a protein, present in the form of a precipitate or crystal. According to the method, one or more diffraction patterns are taken of a precipitate or crystal both in the presence of and in the absence of one or more potential ligands. The diffraction pattern may be taken as described above in regard to FIGS. 1A–1C.

Once taken, the diffraction patterns from when no ligand is present may be compared to the diffraction patterns when potential ligands are present. The binding of the potential ligand to the molecule may be deduced based on a difference between the different diffraction patterns.

In one variation, multiple diffraction patterns are taken of the precipitate or crystal in the absence of any ligands where the angle of x-ray beam relative to the precipitate or crystal is varied. The property of precipitate or crystal may be characterized based on a comparison of the multiple diffraction patterns. Multiple diffraction patterns are also taken of the precipitate or crystal in the presence of one or more ligands where the angle of x-ray beam relative to the precipitate or crystal is varied as in the same manner as when no potential ligands are present.

4. Method for Detecting Microcrystals in a Precipitate

A method is provided for detecting a presence of microcrystalline material in a precipitate. According to the method, a plurality of x-ray diffraction measurements are taken as an x-ray source is moved laterally relative to the precipitate. The resulting diffraction pattern for each measurement is evaluated in order to determine whether microcrystalline material is present in the precipitate.

Knowledge of whether microcrystalline material is formed in a precipitate is valuable information for evaluating the effectiveness of conditions for crystal growth. For example, by knowing if a given precipitate forms microcrystals, the crystalline quality or content of the precipitate can be graded. Precipitates with higher crystalline content (higher degrees of macromolecular order) are more likely to yield diffraction quality crystals upon finer screens.

A further advantage of this method is that it can be used as a form of power diffraction. As discussed in Section 3, a feature of the present invention is the comparison of diffraction in the presence and absence of a potential ligand. The diffraction pattern produced from microcrystals identified according to this method, both in the presence and in the absence of a potential ligand can be used to evaluate whether the ligand binds to the protein or other macromolecule forming the crystalline precipitate.

5. Devices for Screening a Plurality of Experiments

The present invention also relates to various devices for screening one or more plates that comprise a plurality of different experiments with regard to the quality and the crystalline properties of crystals and/or precipitates present in a plurality of experiments.

FIGS. 2A–2D illustrate several embodiments of devices which may be used to screen a sample plate comprising a plurality of different experiments. It should be understood that by being able to move different samples into the path of the x-ray beam, multiple different samples can be analyzed according to any of the methods of the present invention. Accordingly, the present invention thus relates to high throughput methods for analyzing precipitates and/or crystals present in multiple different samples without having to isolate any precipitate or crystal material from the sample plate.

Figure 2A:
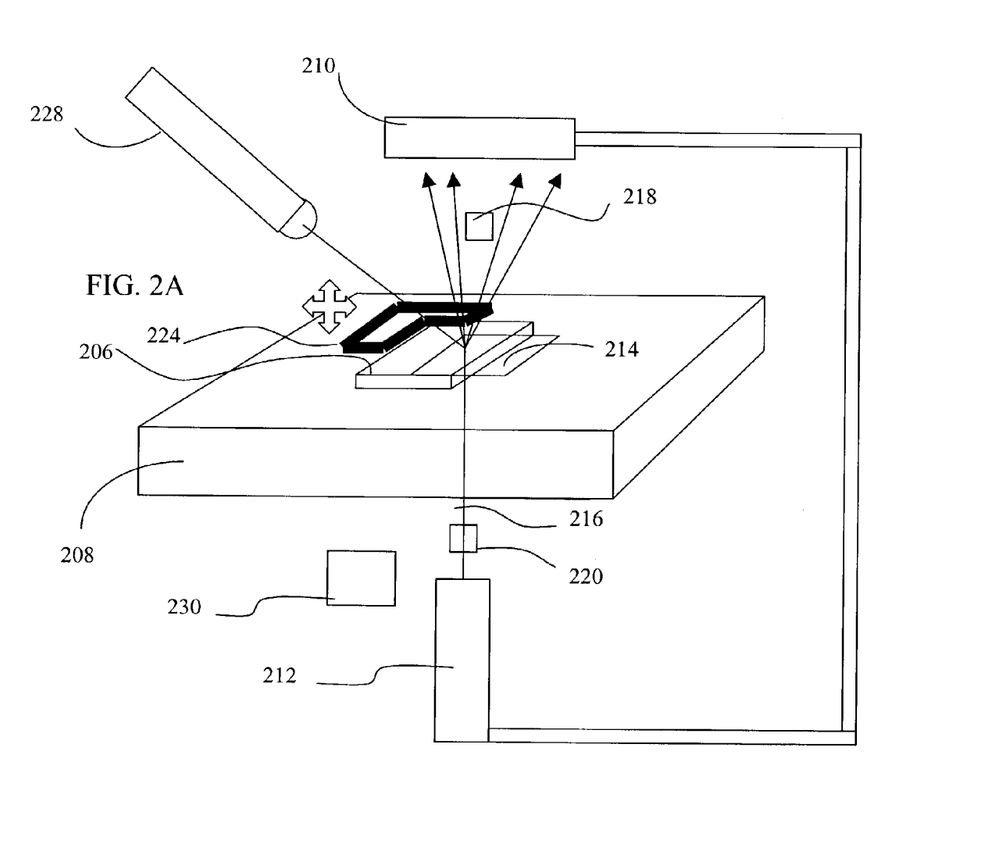
FIG. 2A illustrates a device for screening a plate comprising a plurality of different experiments with regard to the properties of precipitates and/or crystals present in the experiments.

FIG. 2A illustrates an embodiment of a device for screening a sample plate comprising a plurality of experiments where the plate is moved laterally on a stage. As illustrated, a sample plate 206 (e.g., a micro titer plate or sitting drop crystallization plate), comprising a plurality of separate samples is positioned on a stage 208. The separate samples are preferably arranged in an array.

An X-ray detector 210 is positioned above stage 208 and an X-ray source 212 is positioned below the stage 208. A mechanism (not shown) is generally used for rocking the X-ray source 212. As described above, it is desirable to rock the X-ray source 212 during data collection, generally through a 0.05–5.0° angle, preferably a 0.5 to 2° angle.

The stage comprises an aperture 214 through which the x-ray beam 216 from the X-ray source 212 traverses before traversing one of the samples within the sample plate 206. It is noted that the stage may optionally be transmissive to x-rays, in which case an aperture is not needed. As illustrated, a beam stop 218 may optionally be placed in the path of the X-ray detector 210. Use of the beam stop 218 is important when the X-ray detector 210 is in the direct path of the x-ray 216 in order to protect the X-ray detector 210. In situations where the experimental set up is such that the detector is not positioned directly in line with the X-ray beam, the beam stop is optional. A focusing optic 220 is shown below the stage 206 to focus the x-rays prior to reaching the sample.

Illustrated on the stage is a mechanism 224 for laterally moving the sample container relative to the stage 208. It is noted that any mechanism for moving an object on a stage, such as the mechanisms commonly used in microscopy, may be used as the movement mechanism. The mechanism should preferably have sufficiently fine x-y control to precisely align a precipitate or crystal with an x-ray beam.

The movement mechanism 224 also preferably has the ability to move multiple different samples into the path of the x-ray. For example, the movement mechanism 224 preferably is able to move all of the different samples that may be present in a sample plate 206 (e.g., a 8×12 microtiter plate or 8×12 sitting drop crystallization plate) into the path of the x-ray.

A microscope 228 may be used to center of the X-ray beam 216 relative to a portion of a sample within the sample plate 206. To aid this positioning process, a positioner light 230 may be used to backlight the sample.

Figure 2B:
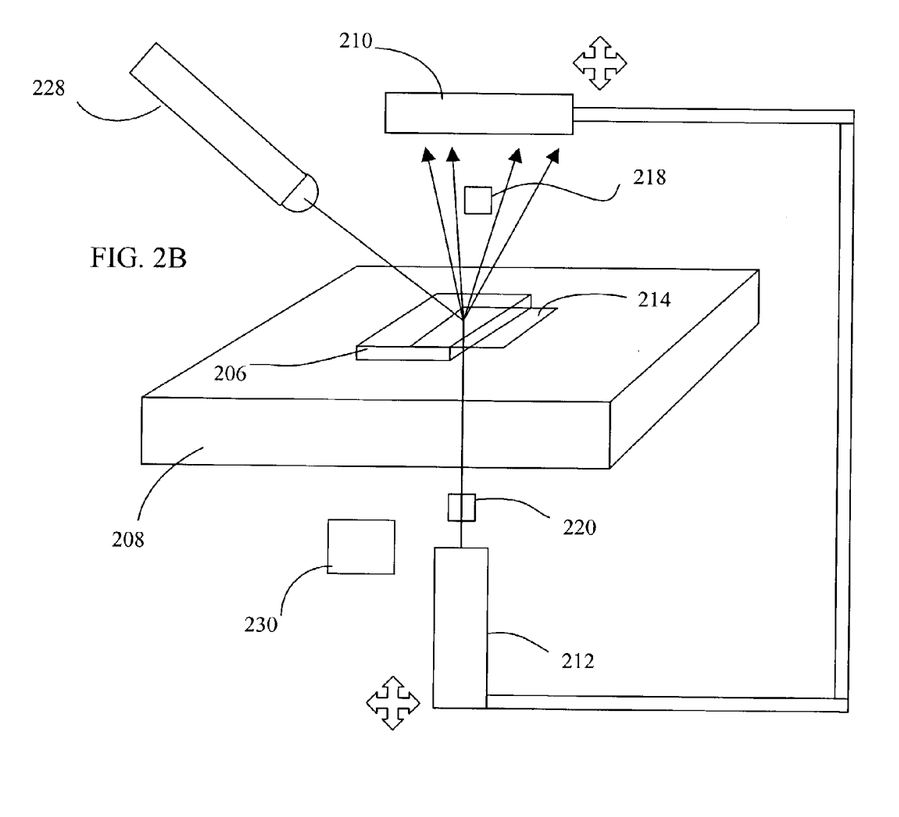
FIG. 2B illustrates another embodiment of a device for screening a plate comprising a plurality of crystallization experiments.

FIG. 2B illustrates an embodiment of a device for screening a plate comprising a plurality of experiments where the x-ray source and imaging element move laterally relative to the plate. As illustrated, a sample plate 206 (e.g., a microtiter plate or sitting drop crystallization plate), comprising a plurality of separate samples is positioned on a stage 208. The separate samples are preferably arranged in an array.

An X-ray detector 210 is positioned above stage 208 and an X-ray source 212 is positioned below the stage 208. The stage comprises an aperture 214 through which the x-ray beam 216 from the X-ray source 212 traverses before traversing one of the samples within the sample plate 206. As illustrated, a beam stop 218 may optionally be placed in the path of the X-ray detector 210. Use of the beam stop 218 is important when the X-ray detector 210 is in the direct path of the x-ray 216 in order to protect the X-ray detector 210. In situations where the experimental set up is such that the detector is not positioned directly in line with the X-ray beam, the beam stop is optional. A focusing optic 220 is shown below the stage 206 to focus the x-rays prior to reaching the sample.

The X-ray detector 210 and the X-ray source 212 are designed to move in unison with each other laterally relative to the stage 208 and hence a sample plate 206 positioned on the stage 208. The mechanism (not shown) for moving the X-ray detector 210 and the X-ray source 212 serves the same purpose as the mechanism 224 shown in FIG. 2A for laterally moving the sample container relative to the stage 208. It is noted that any mechanism for moving the X-ray detector 210 and the X-ray source 212 may be used as the movement mechanism. The mechanism should preferably have sufficiently fine x-y control to precisely align a precipitate or crystal with an x-ray beam.

The movement mechanism used to move the X-ray detector 210 and the X-ray source 212 preferably has the ability to move multiple different samples into the path of the x-ray. For example, the movement mechanism 224 preferably is able to move all of the different samples that may be present in a sample plate 206 (e.g., an 8×12 microtiter plate or 8×12 sitting drop crystallization plate into the path of the x-ray.

As noted previously, a microscope 228 may be used to center of the X-ray beam 216 relative to a portion of a sample within the sample plate 206. To aid this positioning process, a positioner light 230 may be used to backlight the sample.

Figure 2C:
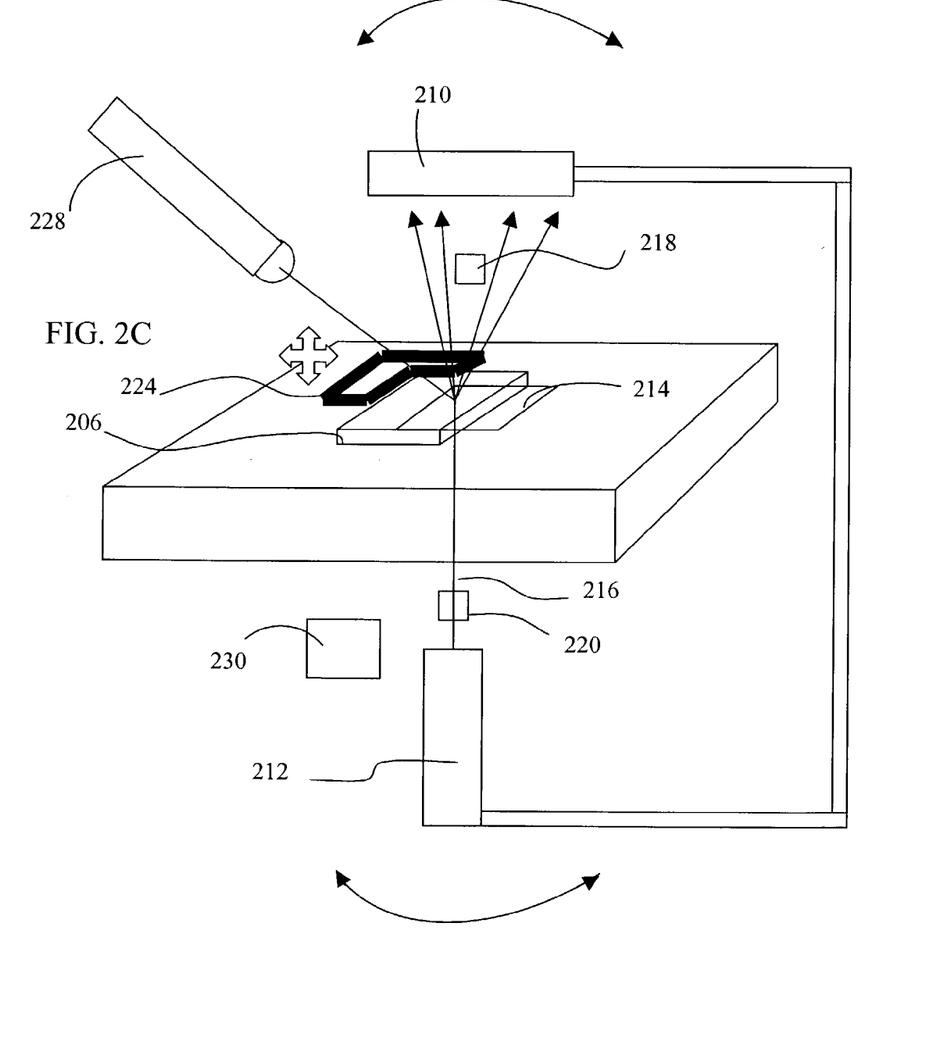
FIG. 2C illustrates an embodiment of a device for screening a plate comprising a plurality of crystallization experiments where the device is able to analyze a precipitate or crystal over a range of angles.

FIG. 2C illustrates an embodiment of a device for screening a plate comprising a plurality of experiments where the plate is moved laterally on a stage and the x-ray source and imaging element move angularly relative to the experiment being imaged. The devices illustrated in FIGS. 2C and 2D correspond to the devices of FIG. 2A and FIG. 2B respectively with the devices further comprising a mechanism for moving the X-ray detector 210 and the X-ray source 212 in unison with each other such that the angle of the x-ray, for example as measured relative to the surface of the stage, changes. As noted above, some methods of the present invention comprise taking multiple measurements of a sample where the x-ray traverses the sample at the same location and thus traverses the same portion of the sample. Meanwhile, the path angle of the x-ray changes so that multiple measurements are taken at different angles.

Figure 2D:
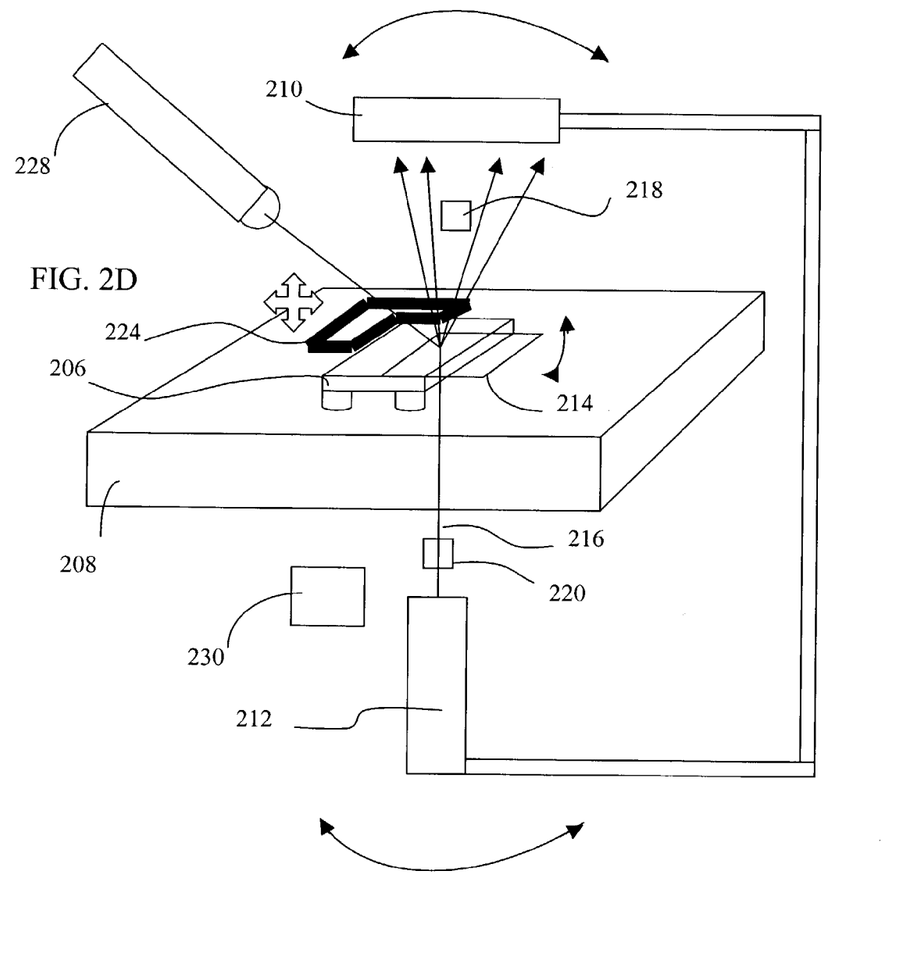
FIG. 2D illustrates another embodiment of a device for screening a plate comprising a plurality of crystallization experiments where the device is able to analyze a precipitate or crystal over a range of angles.

In FIG. 2C, the mechanism 236 for changing the angle of the X-ray accomplishes this by moving the X-ray detector 210 and the X-ray source 212 relative to the sample. By contrast, mechanism 238 is shown in FIG. 2D for tilting the sample relative to the X-ray detector 210 and the X-ray source 212. Other mechanisms for moving the sample, for example by moving the stage, are envisioned and are within the scope of the present invention.

Figure 3:
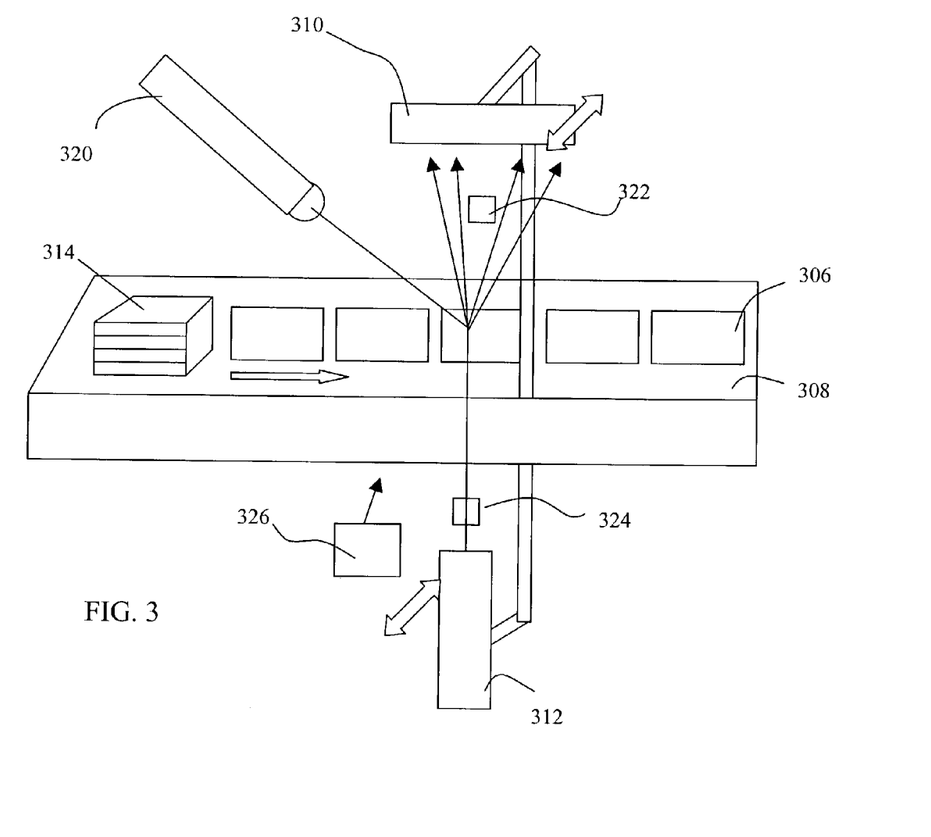
FIG. 3 illustrates a device for screening a plurality of plates comprising a plurality of crystallization experiments.

FIG. 3 illustrates an embodiment of a multi-plate high throughput analyzer. As illustrated, the device comprises an elongated stage 308 for housing a plurality of sample plates 306. The elongated stage 308 comprises a mechanism for moving the sample plates along the stage 308 in an x direction into an analysis zone where an x-ray from X-source 312 traverses the stage 308 and a diffraction pattern is received by X-ray detector 310. As discussed previously, the device may also optionally comprise a beam stop 322, a focusing optic 324, a light source for illuminating the sample 326.

A mechanism (not shown) may be used to cause the X-source 312 and the X-ray detector 310 to move in a y direction relative to the stage so that different regions of a plate may be analyzed. It is noted that the stage may alternatively be designed to also move one or more plates in the y direction. A microscope 320 is also provided for aligning the sample.

It is noted that alternative designs may be employed for a multi-plate high throughput analyzer. For example, the analyzer may be designed as in FIGS. 2A–2D and may further include a robotic mechanism 314 for loading and removing different plates from the stage. Alternative embodiments may also be used which would be appreciated by one of ordinary skill in the art.

EXAMPLES

Provided herein are examples of an x-ray diffraction that was taken according to the present invention.

Example 1

Figure 4A:
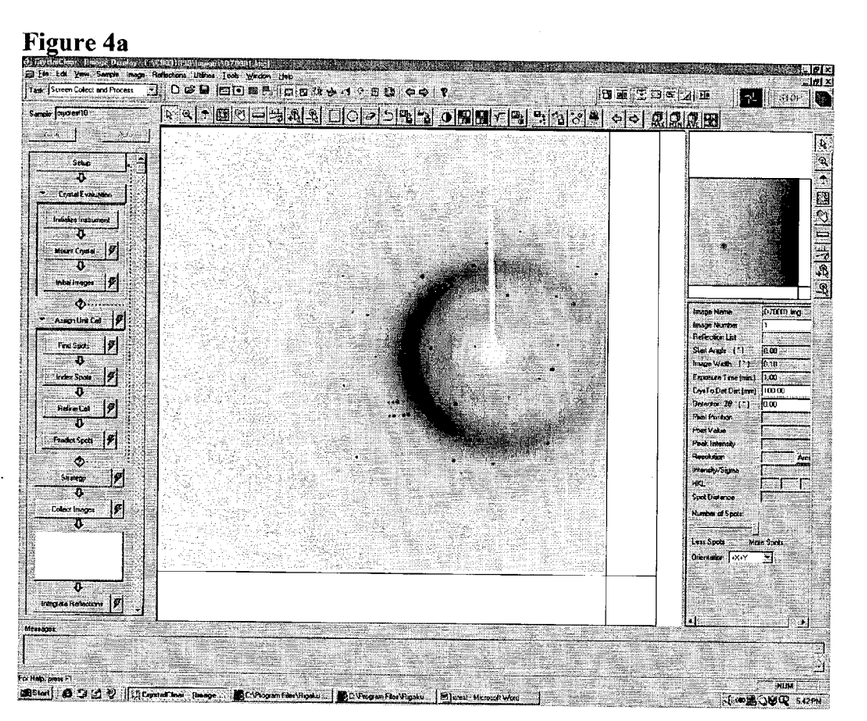
FIG. 4A illustrates the diffraction pattern for an in situ lysozyme crystal as detailed in Example 1.
Figure 4B:
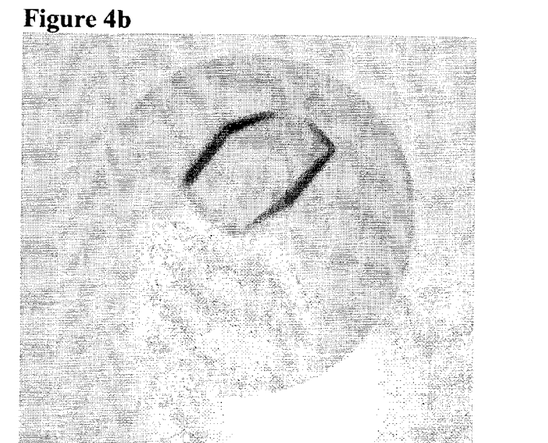
FIG. 4B is an image of the lysozyme crystal, the diffraction pattern of which is shown in FIG. 4A.

Crystals of lysozyme were grown as sitting drops (50 nanoliter) on Greiner plates. The Greiner plates were placed on an X-Y stage mounted on a MicroMax-007 X-ray generator (running at 800 W) with Osmic mirrors, configured to generate X-rays vertically, from the underside of the plates. The beam size was, which can be varied in the range 25 to 1000 microns, was set at 300 microns for this experiment and 1.54 A CuKα radiation was used. An image of the diffraction pattern was collected on a CCD Detector. A snapshot of the output of the detector revealing the diffraction pattern is shown in FIG. 4a. The image is shown using a gray scale where white indicates no X-ray counts and black indicates large numbers of X-ray counts. The images show a diffuse ring pattern due to the background scattering of the plastic substrate (Greiner plate). The diffraction maxima can clearly be seen as sharp spots (darker shade of gray). FIG. 4b shows a picture of the drop used in this experiment. The lysozyme crystal had dimensions of 200×100×20 microns. The crystal was exposed to the X-ray beam for 1 minute and the detector was rotated by a theta angle of 20 degrees and positioned at a distance of 37 mm from the crystal. Diffraction spots were seen to a resolution of 2.0 angstroms (FIG. 4a).

Example 2

Figure 5A:
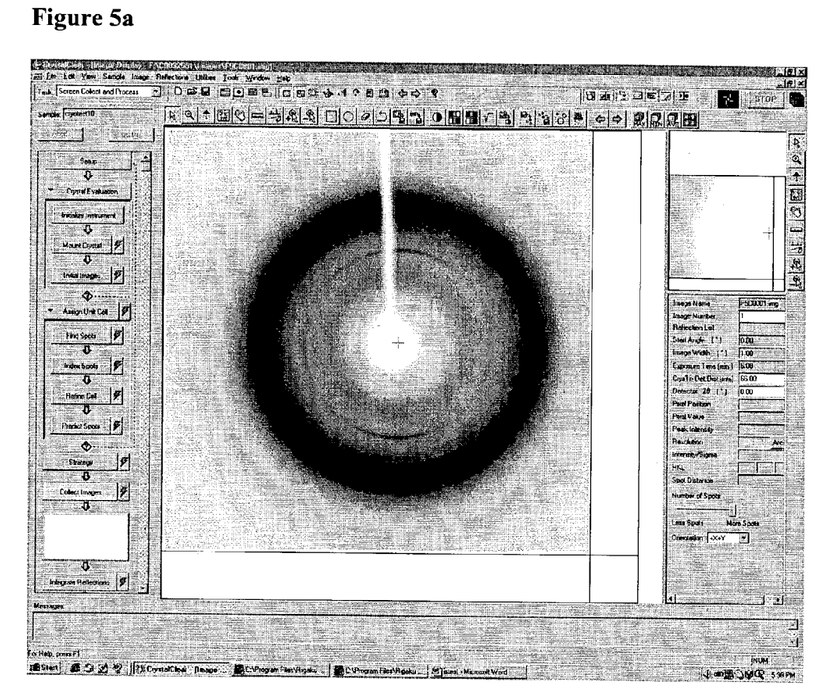
FIG. 5A illustrates the diffraction pattern for an in situ trypsin crystal as detailed in Example 2.
Figure 5B:
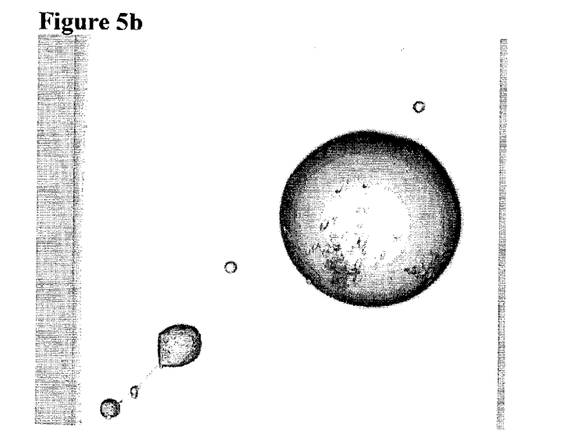
FIG. 5B is an image of the trypsin crystal, the diffraction pattern of which is shown in FIG. 5A.

Crystals of trypsin were grown as sitting drops (50 nanoliter) on Greiner plates. The Greiner plates were placed on an X-Y stage mounted on a MicroMax-007X-ray generator (running at 800 W) with Osmic mirrors, configured to generate X-rays vertically, from the underside of the plates. The beam size was, which can be varied in the range 25 to 1000 microns, was set at 300 microns for this experiment and 1.54 A CuKα radiation was used. An image of the diffraction pattern was collected on a CCD Detector. A snapshot of the output of the detector revealing the diffraction pattern is shown in FIG. 5a. The image is shown using a gray scale where white indicates no X-ray counts and black indicates large numbers of X-ray counts. The images show a diffuse ring pattern due to the background scattering of the plastic substrate (Greiner plate). The diffraction maxima can clearly be seen as sharp spots (darker shade of gray). The detector output reveals only a few orders of diffraction pattern but the results confirm the crystals in the drop are protein. FIG. 5b shows a picture of the drop used in this experiment. The trypsin crystal had dimensions of 10×10×10 microns. The crystal was exposed to the X-ray beam for 5 minutes and the detector was positioned at a distance of 66 mm from the crystal.

Although exemplary embodiments of the present invention have been described and depicted, it will be apparent to the artisan of ordinary skill that a number of changes, modifications, or alterations to the invention as described herein may be made, none of which depart from the spirit of the instant invention. All such changes, modifications, and alterations should therefore be seen as within the scope of the instant invention. It should also be understood that these embodiments are intended in an illustrative or exemplary rather than in a limiting sense, as it is contemplated that modifications will readily occur to those skilled in the art, modifications which will be within the spirit of the invention and the scope of the appended claims. All patents, papers, articles, references and books cited herein are incorporated by reference in their entirety.

What is claimed is:

1. A method for evaluating a crystallization experiment comprising:
    exposing a given location of a crystallization experiment of a molecule to X rays multiple times while the crystallization experiment is housed within a container in which the crystallization experiment is performed where the angle of the x-ray beam is varied relative to the crystallization experiment among the different X-ray exposures; and
    using one or more X-ray diffraction patterns formed from the multiple X-ray exposures to evaluate whether crystalline material is present in the crystallization experiment,
    wherein the crystallization experiment is crystallizing a molecule selected from the group consisting of a macromolecule, a protein, a molecule with a molecular weight of at least 500 Daltons, a molecule with a molecular weight of at least 1000 Daltons, and a protein.

2. A method according to claim 1 wherein the container housing the crystallization experiment is a multiwell plate configured for hanging drop crystallization experiments or sitting drop crystallization experiments, a multiwell plate configured for crystallization experiments under oil, or is a microfluidic device configured to conduct crystallization experiments.

3. A method according to claim 1 wherein the container houses multiple crystallization experiments.

4. A method according to claim 1 wherein the crystallization experiment has a volume of less than 5 microliters.

5. A method according to claim 1 wherein the crystallization experiment has a volume of less than 1 microliter.

6. A method according to claim 1 wherein the angle of the x-ray beam is varied relative to the crystallization experiment between 0.05 degrees to 5 degrees among at least two of the different exposures at the given location of the crystallization experiment.

7. A method according to claim 1 wherein the angle of the x-ray beam is varied relative to the crystallization experiment at least 0.5 degrees among at least two of the different exposures at the given location of the crystallization experiment.

8. A method according to claim 1 wherein the angle of the x-ray beam is varied relative to the crystallization experiment between 0.5 degrees to 2 degrees among at least two of the different exposures at the given location of the crystallization experiment.

9. A method according to claim 1 wherein an X-ray source producing the x-rays that traverse the crystallization experiment and an X-ray detector collecting the x-rays are rotated in unison with each other where the axis of rotation traverses the same portion of crystallization experiment that the x-rays traverse.

10. A method according to claim 1 wherein a microscope is used to position where the x-rays traverse the crystallization experiment.

11. A method according to claim 1, the method further comprising using a microscope to detect a location of a precipitate or crystal in the crystallization experiment and position where x-rays traverse the crystallization experiment so that the x-rays traverse the precipitate or crystal.

12. A method according to claim 9 wherein rotation of the X-ray source and X-ray detector is automated.

13. A method according to claim 1, the method further comprising positioning where x-rays traverse the crystallization experiment so that the x-rays traverse a precipitate or crystal in the crystallization experiment.

14. A method according to claim 1 wherein the X-rays are produced by an x-ray source and collected by an x-ray detector, and the container housing the crystallization experiment is positioned on a stage positioned between the x-ray source and x-ray detector such that the x-rays traverse the stage as well as the container.

15. A method for evaluating a crystallization experiment comprising:
    exposing a crystallization experiment of a molecule to X-rays while housed within a container in which the crystallization experiment is performed; and
    using one or more X-ray diffraction patterns formed from the X-ray exposure to evaluate whether crystalline material is present in the crystallization experiment;
    wherein the portion of the container where the X-rays traverse the container is formed of a crystalline material.

16. A method according to claim 15 wherein the portion of the container where the X-rays traverse the container is formed of a material selected from the group consisting of silicon and quartz.

17. A method for evaluating a crystallization experiment comprising:
    exposing a crystallization experiment of a molecule to X-rays while housed within a container in which the crystallization experiment is performed; and
    using one or more X-ray diffraction patterns formed from the X-ray exposure to detect a crystalline property of a precipitate or crystal present in the crystallization experiment from the diffraction pattern, wherein the crystalline property is selected from the group consisting of resolution, mosaicity and unit cell properties.

18. A method for detecting ligand binding to a protein comprising:
    exposing a precipitate or crystal formed in a first crystallization experiment to X-rays while housed within a container in which the first crystallization experiment is performed and collecting one or more X-ray diffraction patterns;
    taking a precipitate or crystal formed in a second crystallization experiment that further comprises a ligand relative to the first crystallization experiment and exposing the second crystallization to X-rays while housed within a container in which the second crystallization experiment is performed and collecting one or more X-ray diffraction patterns; and
    comparing the diffraction patterns collected from the first and second crystallization experiments, a change in the diffraction patterns between the crystallization experiments indicating the binding of the ligand to the protein.

19. A method for detecting ligand binding to a protein comprising:
    exposing a precipitate or crystal formed in a crystallization experiment to X-rays while housed within a container in which the crystallization experiment is performed and collecting one or more X-ray diffraction patterns;
    adding a ligand to the crystallization experiment;
    exposing the precipitate or crystal crystallization experiment after the ligand has been added to X-rays while housed within a container in which the crystallization experiment is performed and collecting one or more X-ray diffraction patterns; and
    comparing the diffraction patterns collected before and after the ligand is added to the crystallization experiment, a change in the diffraction patterns indicating the binding of the ligand to the protein.

20. A method for detecting ligand binding to a protein comprising:
    forming one or more precipitates or crystals of a molecule in a crystallization experiment housed in a container;
    exposing the one or more precipitates or crystals to X-rays while still housed within the container in which the crystallization experiment is performed and collecting X-ray diffraction patterns, wherein multiple diffraction patterns of the one or more precipitates or crystals are taken at different angles and at different positions laterally relative to the one or more precipitates or crystals; and
    solving the crystal structure of the molecule based on the multiple diffraction patterns collected.

* * * * *